(12) United States Patent
Sugahara et al.

(10) Patent No.: US 9,722,213 B2
(45) Date of Patent: Aug. 1, 2017

(54) METHOD FOR MANUFACTURING ELECTRONIC DEVICE

(75) Inventors: Jun Sugahara, Yonezawa (JP); Hidetaka Ohazama, Yonezawa (JP); Shinsuke Tanaka, Yonezawa (JP); Hiromu Nara, Yonezawa (JP); Hiroki Tan, Yonezawa (JP)

(73) Assignees: PIONEER CORPORATION, Kawasaki-Shi, Kanagawa (JP); TOHOKU PIONEER CORPORATION, Tendo-Shi, Yamagata (JP)

( * ) Notice: Subject to any disclaimer, the term of this patent is extended or adjusted under 35 U.S.C. 154(b) by 238 days.

(21) Appl. No.: 14/385,970

(22) PCT Filed: Mar. 27, 2012

(86) PCT No.: PCT/JP2012/058014
§ 371 (c)(1),
(2), (4) Date: Sep. 17, 2014

(87) PCT Pub. No.: WO2013/145139
PCT Pub. Date: Oct. 3, 2013

(65) Prior Publication Data
US 2015/0079708 A1  Mar. 19, 2015

(51) Int. Cl.
*H01L 51/56* (2006.01)
*H01L 51/52* (2006.01)
(Continued)

(52) U.S. Cl.
CPC .............. *H01L 51/56* (2013.01); *B05D 1/26* (2013.01); *C23C 16/45525* (2013.01);
(Continued)

(58) Field of Classification Search
CPC . H01L 51/56; H01L 51/5253; H01L 21/0272; H01L 21/7688; H01L 27/3246;
(Continued)

(56) References Cited

U.S. PATENT DOCUMENTS 4,119,483 A * 10/1978 Hubsch .............. G03F 7/11
257/E21.025
4,448,636 A * 5/1984 Baber ................ H01L 21/0272
156/272.8
(Continued)

FOREIGN PATENT DOCUMENTS

JP    8-120443 A1    5/1996
JP    2003-208975 A1    7/2003
(Continued)

OTHER PUBLICATIONS

International Search Report dated May 22, 2012, issued for International Application No. PCT/JP2012/058014.

*Primary Examiner* — Michael Trinh
(74) *Attorney, Agent, or Firm* — Procopio, Cory, Hargreaves & Savitch LLP

(57) ABSTRACT

When a coating film 4 is formed on a substrate 1, on which elements 3 are formed, by an ALD film forming method or the like, the coating film 4 is partially removed in a simple step. A method for manufacturing an electronic device includes a step of coating the substrate 1 partially with a partially coating member 2, a step of forming the elements 3 on the substrate 1, a step of forming the coating film 4 on the substrate 1 to cover the elements 3 and the partially coating member 2, and a step of forming a crack 4A in the coating film 4 on the partially coating member 2.

11 Claims, 3 Drawing Sheets

(51) Int. Cl.
*B05D 1/26* (2006.01)
*C23C 16/455* (2006.01)
*H01L 27/32* (2006.01)
*H01L 23/31* (2006.01)

(52) U.S. Cl.
CPC ...... H01L 51/5253 (2013.01); *H01L 23/3171* (2013.01); *H01L 27/3246* (2013.01); *H01L 27/3283* (2013.01); *H01L 2924/0002* (2013.01)

(58) Field of Classification Search
CPC ... H01L 27/3283; G03F 7/3014; G03F 7/428; Y01S 438/951
See application file for complete search history.

(56) References Cited

U.S. PATENT DOCUMENTS

| | | | |
|---|---|---|---|
| 7,704,683 B2* | 4/2010 | Wittenberg | C23C 14/0005 430/311 |
| 2007/0004101 A1* | 1/2007 | Lim | H01L 27/1214 438/149 |
| 2007/0188093 A1* | 8/2007 | Nagara | H01L 51/5253 313/512 |
| 2014/0034994 A1* | 2/2014 | Yamane | H01L 51/5253 257/99 |

FOREIGN PATENT DOCUMENTS

| | | |
|---|---|---|
| JP | 2006-251598 A1 | 9/2006 |
| JP | 2007-234318 A1 | 9/2007 |
| JP | 2007-250520 A1 | 9/2007 |

\* cited by examiner

Fig. 2
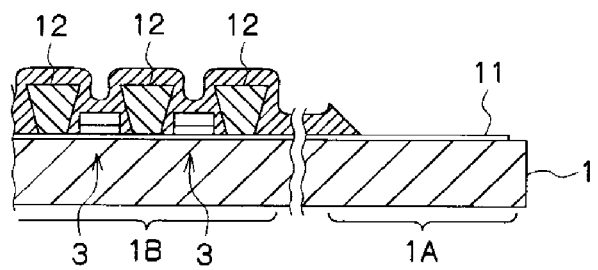
Fig. 3

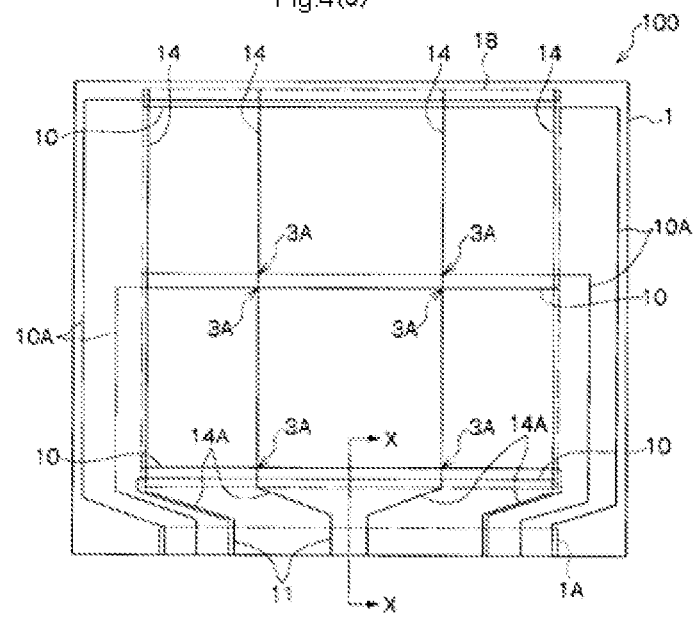
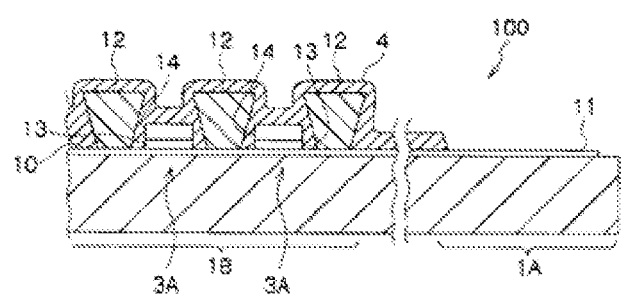

METHOD FOR MANUFACTURING ELECTRONIC DEVICE

TECHNICAL FIELD

The present invention relates to a method for manufacturing an electronic device.

RELATED ART

There is known an electronic device including a coating film that covers an element formed on a substrate. For example, an organic EL device includes, in order to seal an organic EL element on a substrate, a coating film (a sealing film) that covers the organic EL element. The electronic device includes a connection terminal on the substrate. The electronic device including the coating film is disposed on the substrate in a state in which the connection terminal is exposed from the coating film.

A method for manufacturing an organic EL device described in Patent Document 1 includes: a step of, after forming an anode and a connection terminal for external circuit connection on a substrate, provisionally compression-bonding, on the connection terminal, an anisotropic conductive adhesive tape attached with a protection laminate for connecting the connection terminal and the external circuit; a step of thereafter laminating an organic layer and a cathode on the anode to form an organic EL element; a step of forming a coating film (a sealing film) on the organic EL element and the anisotropic conductive adhesive tape; and a step of thereafter peeling the protection laminate of the anisotropic conductive adhesive tape to thereby remove the coating film on the anisotropic conductive adhesive tape.

CITATION LIST

Patent Document

[Patent Document 1] Japanese Patent Application Laid-open No. 2003-208975

SUMMARY OF THE INVENTION

As a film forming method for a coating film that can obtain high sealing performance, an atomic layer deposition film forming method (ALD film forming method) is known. With the film forming method, the coating film covers an entire substrate surface during film formation. A solution less easily permeates because of high moisture barrier properties of the coating film. Etching and liftoff are difficult. Therefore, it is a problem how a connection terminal on the substrate is exposed after the film formation.

As in the related art explained above, there is known a method of peeling a mask tape (in the example explained above, the protection laminate is equivalent to the mask tape) to remove the coating film in a connection terminal area. However, with this method, there is a problem in that a step of sticking the mask tape is complicated and satisfactory productivity is not obtained. In particular, in the case of a multiple substrate in which a plurality of element forming areas are formed on one substrate and when a narrow frame is realized, a plurality of connection terminal areas are present for each of the element forming areas or the connection terminal area is extremely narrow. Therefore, in a sticking step for the mask tape, it is difficult to accurately stick the mask tape and high productivity cannot be realized.

In an organic EL device of the like, there is a demand for frame narrowing for narrowing the connection terminal area. When the frame narrowing is attained, a connection terminal area where a connection terminal is formed and an element forming area where an element such as an organic EL element is formed are close to each other. In this case, with the method of peeling the mask tape, a film around the mask tape sometime peels together with the mask tape. When the connection terminal area and the element forming area are close to each other, there is a concern that sealing performance of the element is deteriorated because the film around the mask tape peels. Therefore, in particular, in order to realize the frame narrowing, it is demanded to accurately remove only the coating film on the connection terminal area to prevent the coating film from adversely affecting the element forming area.

The present invention has an example of an object in dealing with such problems. That is, it is an object of the present invention to, for example, in forming, with the ALD film forming method or the like, a coating film on a substrate on which an element is formed, make it possible to remove the coating film on a connection terminal area with a simple step; make is possible to obtain high productivity in manufacturing of an electronic device for forming the coating film on the substrate, and make it possible to accurately remove only the coating film on the connection terminal area to prevent an element forming area from being adversely affected.

In order to attain such an object, a method for manufacturing an electronic device in the present invention includes at least a configuration explained below.

A method for manufacturing an electronic device including: a step of coating a substrate partially with a partially coating member; a step of forming an element on the substrate; a step of forming a coating film on the substrate to cover the element and the partially coating member; and a step of forming a crack in the coating film on the partially coating member.

BRIEF DESCRIPTION OF THE DRAWINGS

FIGS. 1(a), 1(b), 1(c), 1(d1) and 1(d2) are an explanatory diagrams showing a method for manufacturing an electronic device according to an embodiment of the present invention.

FIG. 2 is an explanatory diagram showing the method for manufacturing an electronic device (a step of removing a coating film on a partially coating member together with the partially coating member) according to the present invention.

FIG. 3 including FIGS. 3(a) and 3(b) illustrate explanatory diagrams showing a method for manufacturing an electronic device (a step of removing a coating film on a partially coating member together with the partially coating member) according to another embodiment of the present invention.

FIG. 4 is an explanatory diagram showing an organic EL device manufactured by a manufacturing method according to the embodiment of the present invention (FIG. 4(a) is a schematic plan view and FIG. 4(b) is an X-X sectional view in FIG. 4(a).

DETAILED DESCRIPTION OF PREFERRED EMBODIMENTS

Figure 1:
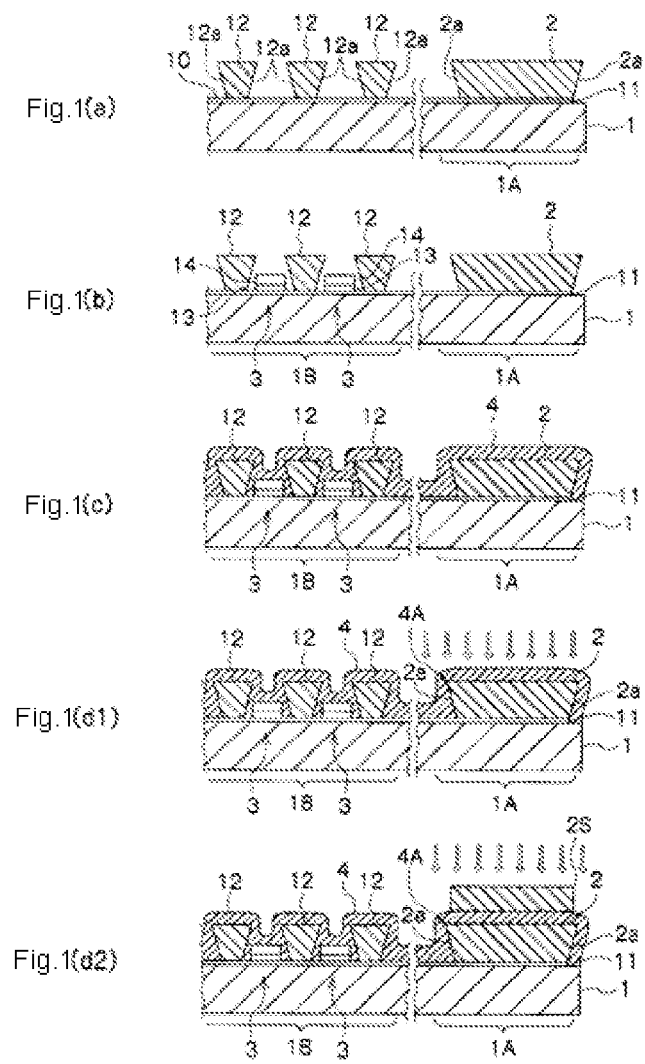

Embodiments of the present invention are explained below with reference to the drawings. The embodiments of the present invention include contents shown in the figures but are not limited to only the contents. FIG. 1 is an explanatory diagram showing a method for manufacturing an electronic device according to an embodiment of the present invention. The method for manufacturing an electronic device according to the embodiment of the present invention includes: a step of coating a substrate 1 partially with a partially coating member 2; a step of forming elements 3 on the substrate 1; a step of forming a coating film 4 on the substrate 1 to cover the elements 3 and the partially coating member 2; and a step of forming a crack in the coating film 4 on the partially coating member 2. The elements are constituent elements used in an electronic circuit and include not only an active element but also a passive element. The elements also include an organic semiconductor, a light-emitting element such as an organic EL, an inorganic EL, and an LED, and a sensor element. The formation on the substrate includes not only direct formation on the substrate but also formation via another object.

Further, a specific example based on FIG. 1 is explained. The method for manufacturing an electronic device according to the embodiment of the present invention includes: a first step (see FIG. 1(a)) of coating a connection terminal area 1A on the substrate 1 with a partially coating member 2; a second step (see FIG. 1(b)) of forming the elements 3 on the substrate 1; a third step (see FIG. 1(c)) of forming the coating film 4 on the substrate 1 to cover the elements 3; and a fourth step (see FIGS. 1(d1) and 1(d2)) of forming a crack in the coating film 4 on the partially coating member 2.

In the first step shown in FIG. 1(a), specifically, a lower electrode 10 is formed on the substrate 1. Connection terminals 11 are formed simultaneously with or separately from the formation of the lower electrode 10. A portion on the substrate 1 where the connection terminals 11 are formed becomes the connection terminal area 1A. The connection terminals 11 formed on the substrate or the connection terminal area 1A on the substrate 1 on which the connection terminals 11 are formed is coated with the partially coating member 2.

The partially coating member 2 itself can be independently formed. However, if the partially coating member 2 is formed simultaneously with other members or in the same step as a step of forming the other members, it is possible to simplify steps. As shown in FIG. 1(a), the partially coating member 2 can be formed simultaneously with partition walls 12, which partition a plurality of electrodes of the elements 3 from one another, or in the same step as a step of forming the partition walls 12. The partially coating member 2 and the partition walls 12 are, for example, resist layer patterns which are formed in a photolithography step. An example of a formation method for the partially coating member 2 and the partition walls 12 is explained. A photosensitive resin layer is applied on the substrate 1, and exposure and development via a photo mask having patterns of the partially coating member 2 and the partition walls 12 are performed to form resist layer patterns of the partially coating member 2 and the partition walls 12. In this case, the partially coating member 2 and the partition walls 12 having reverse taper surfaces 2a and 12a, sides of which face down, are formed with using a difference in development speed caused by a difference in exposure amounts in the thickness direction of the resist layers.

In the second step shown in FIG. 1(b), specifically, the elements 3 are formed on the lower electrode 10 on the substrate. The elements 3 are formed among the partition walls 12. When organic EL elements are formed as an example of the elements 3, organic layers 13 are laminated on the lower electrode 10 and upper electrodes 14 are laminated on the organic layers 13. In this case, patterns of the partition walls 12 are formed in a stripe shape in a direction crossing the lower electrode 10. Then, the upper electrodes 14 can be formed in patterns of the stripe shape partitioned by the partition walls 12. An area where the elements 3 are formed on the substrate 1 becomes an element forming area 1B.

In the third step shown in FIG. 1(c), the coating film 4 is formed on the substrate 1 to cover the elements 3 and the partially coating member 2. When the elements 3 are organic EL elements, the coating film 4 becomes a sealing film that hermetically seals the organic EL elements. The coating film 4 is, for example, an inorganic film. As an example, the coating film 4 can be formed by an atomic layer deposition (ALD) method. The coating film 4 formed by the ALD method is formed over the entire surface on the substrate 1 including the connection terminal area 1A and the element forming area 1B.

In the fourth step shown in FIGS. 1(d1) and (d2), a crack 4A is formed in the coating film 4 on the partially coating member 2. The crack 4A can be formed by applying ultraviolet irradiation process, heating process, or laser irradiation to the partially coating member 2 and the coating film 4 on the connection terminal area 1A. In this case, as the partially coating member 2 and the coating film 4, materials having different expansion rates and shrinkage rates with respect to the ultraviolet irradiation process, the heating process, or the laser irradiation are used. Internal stress occurs in the partially coating member 2 and the coating film 4, which are in contact with each other, because of the difference in the expansion rates or the shrinkage rates. The crack 4A is formed in the weak coating film 4.

Specifically, the partially coating member 2 is formed by a resist layer, the coating film 4 is formed by an inorganic film, and the ultraviolet irradiation process is applied to the partially coating member 2 and the coating film 4 on the connection terminal area 1A. Consequently, the partially coating member 2 shows a larger expansion rate than the coating film 4. The crack 4A is formed in the coating film 4. When the partially coating member 2 has the reverse taper surface 2a, the crack 4A tends to be formed to correspond to an acute edge at the upper end edge of the partially coating member 2. In this case, the crack 4A is formed along the end of the partially coating member 2.

The ultraviolet irradiation process, the heating process, or the laser irradiation on the partially coating member 2 and the coating film 4 may be directly applied to the coating film 4 as shown in FIG. 1(d1) or may be applied via another partially coating member 2S laminated on the coating film 4 as shown in FIG. 1(d2). The other partially coating member 2S is a member for making it easy to generate the internal stress in the coating film 4 on the partially coating member 2. It is preferable to select a member having an expansion rate or a shrinkage rate larger than that of the partially coating member 2 or a member having an expansion rate or a shrinkage rate opposite to that of the partially coating member 2 (when the partially coating member 2 expands, the partially coating member 2S shrinks and, when the partially coating member 2 shrinks, the partially coating member 2S expands).

When the partially coating member 2 and the partition walls 12 are formed in the same step as explained above, it is necessary to prevent a crack from being formed in the coating film 4 in parts where the partition walls 12 are formed. As a method for preventing a crack from being formed, first, as a material of the partition walls 12 or the partially coating member 2, a material is used that has a shrinkage rate of a degree for not allowing a crack to be formed in a degree of process in a hardening step for forming the partition walls 12. When the crack 4A is caused, parts other than the partially coating member 2 are shielded from light (masked) and an ultraviolet ray stronger than that during hardening of the partition walls 12 is irradiated on the partially coating member 2. Alternatively, a laser that is absorbed in resin and generates heat such as a $CO_2$ laser is used. The laser is selectively irradiated on the coating film 4 on the partially coating member 2 after the hardening of the partition walls 12.

When the partially coating member 2 and the partition walls 12 are formed in separate processes and are formed of different materials, a material having an expansion rate or a shrinkage rate larger than that of the partition wall 12 is used as the partially coating member 2. In this case, a pattern forming method by photolithography, printing, inkjet, or the like can be adopted for the formation of the partially coating member 2. In this case, as explained above, a method of selectively applying the ultraviolet or laser irradiation on the coating film 4 on the partially coating member 2 or partially heating the coating film 4 can be adopted.

FIG. 2 shows the method for manufacturing an electronic device according to the embodiment of the present invention and a step of removing the coating film on the connection terminal area together with the partially coating member. In the step shown in FIG. 2, the coating film 4 on the connection terminal area 1A is removed together with the partially coating member 2 to expose the connection terminals 11. The coating film 4 on the partially coating member 2 is easily removed by the formation of the crack 4A. Process liquid under the coating film 4 can be caused to permeate by the formation of the crack 4A. Therefore, the partially coating member 2 can be melted by the process liquid. Specifically, the entire substrate 1 is immersed in a container including the process liquid to cause the process liquid to permeate to the connection terminal area 1A where the crack 4A is formed. In this case, since the element forming area 1A is covered by the coating film 4, the element forming area 1A is not affected by the process liquid. When the substrate 1 is a multiple substrate including a plurality of the element forming areas 1B, the coating film 4 in a plurality of the connection terminal areas 1A on the substrate 1 can be simultaneously removed to expose the connection terminals 11 in one step of immersing the entire substrate 1 in the process liquid.

FIG. 3 is an explanatory diagram showing a method for manufacturing an electronic device (a step of removing the coating film on a partially coating member together with the partially coating member) according to another embodiment of the present invention. An example is shown in which the partially coating member 2 is formed on the element 3 and a part of the element 3 is exposed. In a sensor element for gas or the like, a sensing surface of the sensor element needs to be exposed. In this case, as shown in FIG. 3(*a*), the partially coating member 2 is formed in a portion desired to be exposed on the element 3. The element 3 and the partially coating member 2 are covered by the coating film 4. Thereafter, as in the embodiment explained above, the crack 4A is formed in the coating film 4 on the partially coating member 2. As shown in FIG. 3(*b*), the coating film 4 on the partially coating member 2 is removed together with the partially coating member 2 to expose a sensing surface 3S and the like of the sensor element. As a step of removing the coating film 4 on the partially coating member 2 together with the partially coating member 2, a method same as the method in the embodiment explained above can be adopted.

FIG. 4 is an explanatory diagram showing an organic EL device manufactured by the manufacturing method according to the embodiment of the present invention explained above (FIG. 4(*a*) is a schematic plan view and FIG. 4(*b*) is an X-X sectional view in FIG. 4(*a*). In an organic EL device 100, a plurality of organic EL elements 3A are arrayed on the substrate 1. In an example shown in the figure, an area on the substrate 1 where the organic EL elements 3A are arrayed in a dot matrix shape is the element forming area 1B. An area where the connection terminals 11 are arranged is the connection terminal area 1A. The organic EL elements 3A include the lower electrodes 10, the organic layers 13, and the upper electrodes 14. The lower electrodes 10 are arranged in a stripe shape along one direction. The upper electrodes 14 are partitioned by the partition walls 12 and arranged in a stripe shape in a direction crossing the lower electrodes 10.

The organic EL elements 3A on the substrate 1 are coated by the coating film 4 to be hermetically sealed. The coating film 4 is removed in the connection terminal area 1A. The connection terminals 11 are exposed. The lower electrodes 10 of the organic EL elements 3A conduct to the connection terminals 11 via lead-out wires 10A. The electrodes 14 conduct to the connection terminals 11 via lead-out wires 14A.

The substrate 1 is light transmissive and is formed of a base material that can support the organic EL elements 3A such as glass and plastics. As transparent conducive film layers forming the lower electrodes 10, a transparent metal oxide such as an ITO (Indium Tin Oxide), an IZO (Indium Zinc Oxide), a zinc oxide transparent conductive film, an $SnO_2$ transparent conductive film, and a titanium dioxide transparent conductive film can be used.

When the lower electrodes 10 are patterned and formed as a plurality of electrodes, a not-shown insulating film is provided to secure insulation among the electrodes. As the insulating film, a material such as polyimide resin, acrylic resin, silicon oxide, or silicon nitride is used. As the formation of the insulating film, after the material of the insulating film is formed as a film on the substrate 1 on which the lower electrodes 10 are patterned and formed, a patterning for forming an opening, which forms a light-emitting area for each of the organic EL elements 3A, on the lower electrodes 10 is performed. Specifically, a film is formed on the substrate 1, on which the lower electrodes 10 are formed, by a spin coat method at predetermined application thickness. Exposure process and development process are applied to the film using an exposure mask, whereby a layer of the insulting layer having an opening pattern shape of the organic EL element 3A is formed. The insulating film is formed to fill spaces among the patterns of the lower electrodes 10 and cover a part of side end portions of the lower electrodes 10. When the organic EL elements 3A are arranged in a dot matrix shape, the insulating film is formed in a lattice shape.

The partition walls 12 are formed in a stripe shape in a direction crossing the lower electrodes 10 in order to form patterns of the upper electrodes 14 without using a mask or the like or completely electrically insulating the upper electrodes 14 adjacent to one another. Specifically, after an insulating material such as photosensitive resin is applied and formed on the insulating film by the spin coat method at film thickness larger than a sum of the film thicknesses of the organic layers 13 and the upper electrodes 14 forming the organic EL elements 3A, an ultraviolet ray or the like is irradiated on the photosensitive resin film via a photo mask having stripe-shaped patterns crossing the lower electrodes 10. The partition walls 12 having the reverse taper surfaces 12a, the sides of which face down, are formed making use of a difference in development speed that occurs because of a difference in exposure amounts in the thickness direction of the layers.

The organic layer 13 has a laminated structure of light-emitting functional layers including a light-emitting layer. When one of the lower electrode 10 and the upper electrode 14 is set as an anode and the other is set as a cathode, a hole-injection layer, a hole transport layer, a light-emitting layer, an electron transport layer, an electron injection layer, and the like are selectively formed in order from the anode side. Vacuum vapor deposition or the like is used as dry film formation of the organic layer 13. Application or various printing methods are used as dry film formation.

A formation example of the organic layer 13 is explained below. For example, first, NPB (N,N-di(naphtalence)-N,N-dipheneyl-benzidene) is formed as the hole transport layer. The hole transport layer has a function of transporting holes injected from the anode to the light-emitting layer. The hole transport layer may be one laminated layer or may be two or more laminated layers. As the hole transport layer, one layer may be formed by a plurality of materials rather than film formation by a single material. A guest material having high charge grant (acceptance) properties may be doped in a host material having a high charge transport ability.

Subsequently, a light-emitting layer is formed on the hole transport layer. As an example, light-emitting layers of red (R), green (G), and blue (B) are formed in respective film forming areas using a mask for selective painting according to resistance heat vapor deposition. As red (R), an organic material that emits red light such as a styryl dye such as DCM1 (4-(dicyanomethylene)-2-methyl-6-(4'-dimethyl-amino styryl)-4H-pyran) is used. As green (G), an organic material that emits green light such as an aluminum quinolinol complex (Alq3) is used. As blue (B), an organic material that emits blue light such as a distyryl derivative or a triazole derivative is used. Naturally, the light-emitting layers may be formed of other materials or may be formed in a host-guest system layer structure. A light emitting form may be a form using a fluorescent light-emitting material or using a phosphorescence light-emitting material.

The electron transport layer formed on the light-emitting layer is formed by various film forming methods such as the resistance heat vapor deposition using various materials such as an aluminum quinolinol complex (Alq3). The electron transport layer has a function of transporting electrons injected from the cathode to the light-emitting layer. The electron transport layer may include one laminated layer or a multilayer structure of two or more laminated layers. As the electron transport layer, one layer may be formed by a plurality of materials rather than film formation by a single material. A guest material having high charge grant (acceptance) properties may be doped in a host material having a high charge transport ability.

When the upper electrode 14 formed on the organic layer 13 is the cathode, a material (metal, a metal oxide, a metal fluoride, an alloy, etc.) having a work function (e.g., equal to or smaller than 4 eV) smaller than a work function of the anode can be used. Specifically, a meal film of aluminum (Al), indium (In), magnesium (Mg), or the like, an amorphous semiconductor such as doped polyaniline or doped polyphenylene vinylene, and an oxide such as $Cr_2O_3$, NiO, or $Mn_2O_5$ can be used. As a structure, a single layer structure by a metal material, a laminated structure such as $LiO_2$/Al, and the like can be adopted.

As the coating film 4 functioning as the sealing film for sealing the organic EL element 3A, as an example, a single layer or a multilayer film of metal or silicon oxide, nitride, or oxynitride formed by atomic layer deposition can be used. For example, an aluminum oxide film (e.g., an $Al_2O_3$ film) obtained by reaction of alkyl metal such as TMA (trimethylaluminum), TEA (triethylaluminum), or DMAH (dimethylaluminum hydride) and, water, oxygen, or alcohol, a silicon oxide film (e.g., $SiO_2$ film) obtained by reaction of a vaporized gas of a silicon material and a vaporized gas of water, or the like can be used.

As explained above, with the method for manufacturing an electronic device according to the embodiment of the present invention, when the coating film 4 is formed on the substrate 1, on which the elements 3 are formed, by the ALD film forming method or the like, the coating film 4 on the connection terminal area 1A can be removed in a simple step. Even when the substrate 1 is the multiple substrate including the plurality of element forming areas 1B, the connection terminals 11 in all the connection terminal areas 1A can be exposed in one step of immersing the substrate 1 in the process liquid. Therefore, it is possible to obtain high productivity in manufacturing of an electronic device in which the coating film 4 is formed on the substrate 1.

The crack 4A can be formed in the coating film 4. The partially coating member 2 can be dissolved by the process liquid caused to permeate from the crack 4A. Therefore, it is possible to accurately remove the coating film 4 only in the connection terminal area 1A where the partially coating member 2 is formed. Consequently, even in an electronic device in which frame narrowing is attained, it is possible to remove only the coating film 4 on the connection terminal area 1A to prevent the element forming area 1B from being adversely affected.

The embodiments of the present invention are explained in detail above with reference to the drawings. However, a specific configuration is not limited to the embodiments. A change and the like of design within a range not departing from the spirit of the present invention are also included in the present invention. The description contents of the embodiments shown in the figures can be combined as long as there is no particular contradiction or problems in the purposes, the configurations, and the like of the embodiments. The described contents of the figures could be independent embodiments. The embodiments of the present invention are not limited to one embodiment obtained by combining the figures.

What is claimed is:

1. A method for manufacturing an electronic device comprising:
   a step of coating a substrate partially with a partially coating member;
   a step of forming an element on said substrate;
   a step of forming a coating film on said substrate to cover said element and said partially coating member;
   a step of forming a crack in said coating film on said partially coating member; and
   a step of removing said coating film on said partially coating member together with said partially coating member,
   wherein said partially coating member has a reverse taper surface on a side thereof, said coating film is formed so as to cover said reverse taper surface in said step of forming said coating film, and said crack is formed along an acute edge at an upper end edge of said partially coating member.

2. The method for manufacturing an electronic device according to claim 1, wherein said partially coating member and said coating film have different shrinkage rates or expansion rates.

3. The method for manufacturing an electronic device according to claim 1, wherein, ultraviolet irradiation process, heating process, or laser irradiation is applied to said partially coating member and said coating film on a connection terminal area in the step of forming said crack.

4. The method for manufacturing an electronic device according to claim 1, wherein said element is an organic EL element, and said coating film is a sealing film that seals said organic EL element.

5. The method for manufacturing an electronic device according to claim 4, wherein said coating film is an atomic layer deposition (ALD) film.

6. The method for manufacturing an electronic device according to claim 4, wherein said partially coating member is a resist layer pattern which is formed in a photolithography step.

7. The method for manufacturing an electronic device according to claim 6, wherein said partially coating member is formed in a same step as a step of forming partition walls for partitioning a plurality of electrodes from one another.

8. The method for manufacturing an electronic device according to claim 1, wherein said partially coating member coats a connection terminal formed on said substrate.

9. The method for manufacturing an electronic device according to claim 1, wherein said partially coating member is formed by printing or inkjet.

10. The method for manufacturing an electronic device according to claim 1, wherein the step of removing said coating film is performed by causing process liquid to permeate from said crack and dissolving said partially coating member.

11. The method for manufacturing an electronic device according to claim 1, wherein said substrate is a multiple substrate including a plurality of element forming areas, and said coating film on a plurality of connection terminal areas is removed by immersing said entire substrate in a process liquid.

* * * * *